(12) United States Patent
Fattinger (10) Patent No.: US 7,669,310 B2
(45) Date of Patent: Mar. 2, 2010

(54) METHOD OF MANUFACTURING AN ACOUSTIC MIRROR

(75) Inventor: Gernot Fattinger, Munich (DE)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 385 days.

(21) Appl. No.: 11/583,380

(22) Filed: Oct. 18, 2006

(65) Prior Publication Data

US 2007/0266548 A1    Nov. 22, 2007

(30) Foreign Application Priority Data

May 17, 2006    (DE)    ........................ 10 2006 023 165

(51) Int. Cl.
*H04R 31/00* (2006.01)

(52) U.S. Cl. ...................... 29/594; 29/609.1; 156/89.11; 156/89.12; 156/250; 181/171; 181/172; 367/140; 367/141; 367/170; 367/171; 367/181; 381/173; 381/174; 381/175; 381/396; 381/398

(58) Field of Classification Search ................ 29/592.1, 29/594, 609.1; 156/89.11, 89.12, 250; 181/171, 181/172; 367/140, 141, 170, 171, 181; 381/173–175, 381/396, 398

See application file for complete search history.

(56) References Cited

U.S. PATENT DOCUMENTS 7,170,215 B2 * 1/2007 Namba et al. ............... 310/324
2007/0199185 A1 * 8/2007 Thalhammer et al. ...... 29/25.35

FOREIGN PATENT DOCUMENTS

EP    1 227 582 A2    7/2002

* cited by examiner

Primary Examiner—Paul D Kim (57) ABSTRACT

An acoustic mirror of alternately arranged layers of high and low acoustic impedances is manufactured in that a basic material having a first layer of the layer sequence is initially provided, on which a second layer of the layer sequence is created on the first layer such that the second layer of the layer sequence partially covers the first layer. Subsequently, a planarization layer is applied onto the layer sequence, and the planarization layer is removed in an area which in the common layer plane projects laterally beyond the second layer so as to result in a residual planarization layer. Finally, a termination layer is applied onto the layer sequence and the residual planarization layer.

10 Claims, 6 Drawing Sheets

(PRIOR ART)

FIG. 5

METHOD OF MANUFACTURING AN ACOUSTIC MIRROR

CROSS-REFERENCE TO RELATED APPLICATIONS

This application claims priority from German Patent Application No. 102006023165.1, which was filed on May 17, 2006, and is incorporated herein by reference in its entirety.

FIELD OF THE INVENTION

The present invention relates to the field of piezoelectric resonators, e.g. BAW (bulk acoustic wave) resonators, and particularly to a method of manufacturing an acoustic mirror for piezoelectric resonators, as well as to a method of manufacturing a piezoelectric resonator.

BACKGROUND

Radio-frequency filters based on BAW resonators are of great interest for many RF applications. Substantially, there are two concepts for BAW resonators, so-called thin film BAW resonators (FBAR), on the one hand, as well as so-called solidly mounted resonators (SMR). Thin film BAW resonators include a membrane on which the layer sequence consisting of the lower electrode, the piezoelectric layer, and the upper electrode is arranged. The acoustic resonator develops by the reflection at the upper side and at the lower side of the membrane. In the alternative concept of solidly mounted resonators, an SMR includes a substrate, for example a silicon substrate, on which the layer sequence consisting of the lower electrode, the piezoelectric layer, and the upper electrode is arranged. So as to keep the acoustic waves in the active region in this design, a so-called acoustic mirror is required. It is located between the active layers, i.e. the two electrodes and the piezoelectric layer, and the substrate. The acoustic mirror consists of an alternating sequence of layers with high and low acoustic impedance, respectively, e.g. layers of tungsten (high acoustic impedance) and layers of oxide material (low acoustic impedance). In the following, layers of high or low acoustic impedances, respectively, are understood to mean layers which define, when superimposed, a transition area where acoustic waves are reflected; to be precise, the larger the difference between the acoustic impedances of the layers, the higher the intensity with which acoustic waves are reflected.

If the mirror contains layers of conducting materials, such as tungsten, it is recommended, for the avoidance of parasitic capacitances in the filter, to structure (pattern) and substantially limit the corresponding mirror layers to the area below the active resonator region. The disadvantage of this procedure is that the topology resulting hereby cannot be completely planarized. Due to the unevenness, undesired modes are induced in the resonator and/or a reduction in the quality of the resonator is caused. This problem is very critical in so far as already small steps or remaining topologies of several percent of the layer thickness have significant influence on the operation behavior of such a resonator.

Figure 4:
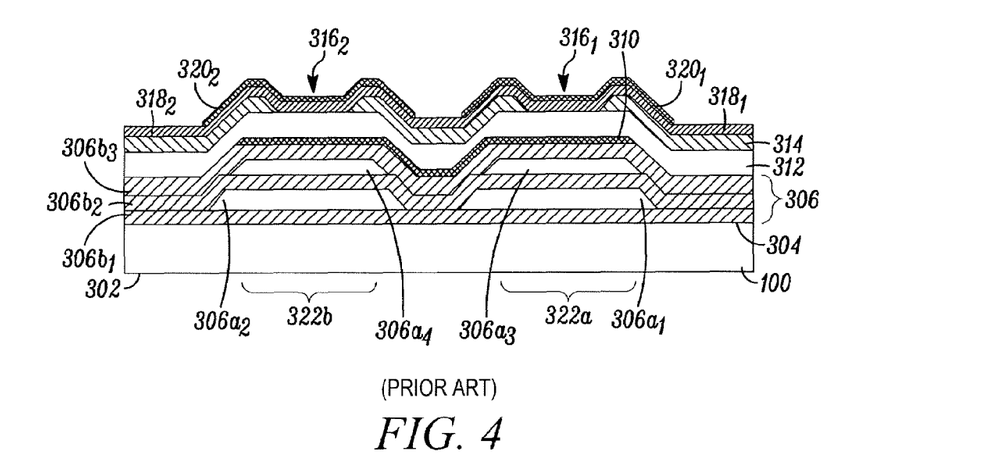
FIG. 4 shows a first example of a solidly mounted resonator with structured mirror according to the prior art.
Figure 5:
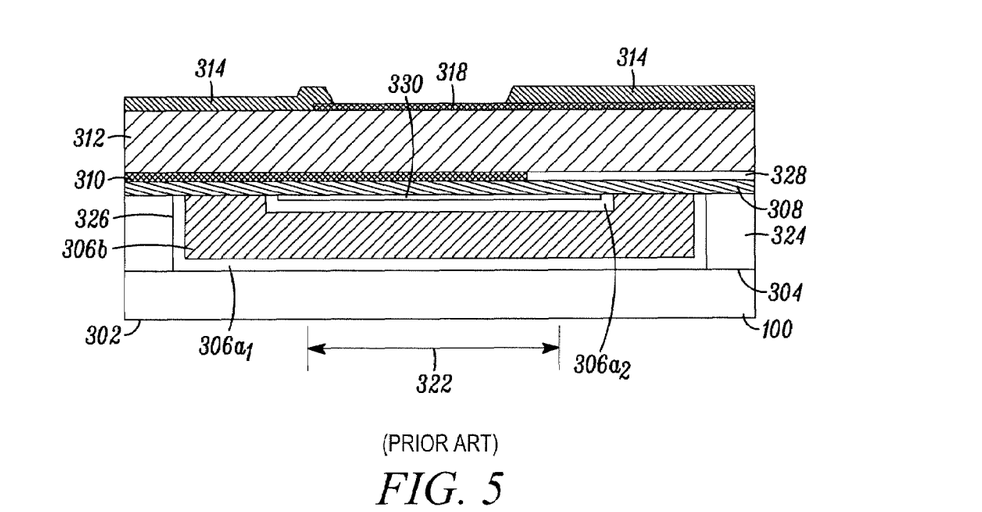
FIG. 5 shows a second example of a solidly mounted resonator with structured mirror according to the prior art.

On the basis of FIGS. 4 and 5, two known methods of manufacturing acoustic mirrors for piezoelectric resonators or BAW resonators are explained in greater detail.

FIG. 4 shows a solidly mounted resonator with structured mirror. The resonator includes a substrate 100 with a lower surface 302 and an upper surface 304. A layer sequence 306 forming the acoustic mirror is arranged on the upper surface. Between the substrate and the mirror, one or more intermediate layers serving for stress reduction or adhesion improvement may be arranged, for example. The layer sequence includes alternately arranged layers 306a with high acoustic impedance and layers 306b with low acoustic impedance, wherein intermediate layers may be provided between the mirror layers. On the upper surface 304 of the substrate 100, a first layer $306b_1$ with low acoustic impedance is formed. On the layer $306b_1$, a material $306a_1$, $306a_2$ with high acoustic impedance is deposited and structured at the portions associated with the active regions of the resonator. Over this arrangement, a second layer $306b_2$ with low acoustic impedance is deposited, upon which in turn a material $306a_3$, $306a_4$ with high acoustic impedance is deposited and structured section-wise. Upon this layer sequence, again a layer with low acoustic impedance $306b_3$ is deposited. On the resulting mirror structure, a lower electrode 310, on which again the active or piezoelectric layer 312, for example of AlN (AlN=aluminum nitride), is arranged, is at least partially formed. On the piezoelectric layer 312, an insulation layer 314 covering the piezoelectric layer 312 except for the regions $316a_1$ and $316b_1$ is formed. Two upper electrodes $318_1$ and $318_2$ in contact with the piezoelectric layer in the portions $316_1$ and $316_2$ are formed on the piezoelectric layer. A tuning layer $320_1$ and $320_2$, via the thickness of which a resonance frequency of the resonators can be adjusted, is at least partially arranged on the upper electrode $318_1$, $318_2$. By the portions of the upper electrode $318_1$ and $318_2$ in which it is in connection with the piezoelectric layer 312, and the underlying portions of the lower electrode 310, two BAW resonators 322a and 322b are defined. The mirror structure 306 shown in FIG. 4 includes $\lambda/4$ mirror layers 306a, 306b.

In the example of a solidly mounted resonator shown in FIG. 4, the metallic layers 306a are structured without planarizing the resulting topology. The layers 306b with low acoustic impedance are deposited over the structured layers 306a, as described above. Thereby, the steps shown in FIG. 4, which continue in the deposition of the overlaying layers, develop. This procedure is disadvantageous regarding the resulting strong topology in the layers lying above the mirror 306, in particular, with reduced piezoelectric coupling of the active layer 312, low resonator quality or increased excitation of undesired vibrational modes arising, it being possible for this to lead to a total failure of the device.

FIG. 5 shows a further example known in the prior art for solidly mounted resonators with a structured mirror. In FIG. 5, again a substrate 100 is shown, on the upper surface 304 of which an oxide layer 324 is deposited, into which a pit or depression 326 is introduced. Further intermediate layers may be provided between the oxide layer 324 and the substrate 300. In the pit 326, the acoustic mirror is formed, which consists of a layer sequence comprising a first layer $306a_1$ with high acoustic impedance, a layer 306b with low acoustic impedance, and a layer $306a_2$ with high acoustic impedance. On the surface of the resulting structure, an insulation layer 308 is deposited, on which the lower electrode 310 is at least partially formed. The portion of the insulation layer 308 not covered by the lower electrode 310 is covered by a further insulation layer 328. On the insulation layer 328 and on the lower electrode 310, the piezoelectric layer 312 is formed, on the surface of which the upper electrode 318 is in turn partially formed. The portions of the piezoelectric layer 312 not covered by the upper electrode 318, as well as parts of the upper electrode 318 are covered by the passivation layer 314. The overlapping areas of lower electrode 310, piezoelectric layer 312, and upper electrode 318 define the BAW resonator 322.

In the example shown in FIG. 5, the pit 326, in which the mirror layers 306a, 306b are deposited one after the other, as described above, is etched into the oxide layer 324 in the area of the resonator 322 to be produced. By one or more CMP (chemical mechanical polishing) processes, the layers outside the mirror pit 326 are removed.

Both methods exhibit disadvantages. The method described by means of FIG. 4 exhibits, for example, the disadvantage of a high level of topology in the layers overlaying the mirror, which results in unfavorable conditions for further processing. This shows, among other things, in reduced piezoelectric couplings, low resonator quality or undesired modes up to a total failure of the device. The method described using FIG. 5 is disadvantageous in that in the corners of mirror pit 326, the layers are slightly thinner, and in that during planarizing, a slight dish topology, which is indicated by reference numeral 330 in FIG. 5, is formed in the resonator area 322, which in turn leads to increased excitation of undesired modes and to reduced resonator quality. Furthermore, the method described using FIG. 5 is disadvantageous in that the topmost mirror layer is attacked to varying degrees across the active area of the resonator in the various CMP steps, which leads to increased excitation of undesired modes and to reduced resonator quality. On the other hand, a certain residual topology cannot be avoided, which will lead to the above-listed disadvantages in subsequent processing. It is to be noted here that the residual topology created by the so called mirror pit and the subsequent CMP steps is a significant yield-limiting factor.

SUMMARY

A method of manufacturing acoustic mirrors is disclosed herein. The method comprises providing a basic material. A first layer of a layer sequence is provided on the basic material. A second layer of the layer sequence is applied on the first layer. The second layer of the layer sequence partially covers the first layer. The first layer and the second layer provide a layer sequence of alternately arranged layers of high acoustic impedance and low acoustic impedance. In addition, the first layer and the second layer are arranged in parallel in relation to a common layer plane.

After providing the first layer and the second layer, a planarization layer is applied on the layer sequence. The planarization layer is then removed in an area which, in relation to the common layer plane, projects outward beyond the second layer. Removal of the planarization layer in the area results in a residual planarization layer. A termination layer is applied onto the layer sequence and the residual planarization layer.

The above described features and advantages, as well as others, will become more readily apparent to those of ordinary skill in the art by reference to the following detailed description and accompanying drawings.

DESCRIPTION

In accordance with at least one embodiment of the invention, a method of manufacturing an acoustic mirror provides alternately arranged layers of high and low acoustic impedances, wherein the acoustic mirror includes a layer sequence of at least one layer with high acoustic impedance and at least one layer with low acoustic impedance, wherein the layers are arranged in parallel in relation to a common layer plane. The method includes the steps of (a) providing a basic material having a first layer of the layer sequence on the basic material; (b) creating a second layer of the layer sequence on the first layer, such that the second layer of the layer sequence partially covers the first layer; (c) applying a planarization layer onto the layer sequence; (d) removing the planarization layer in an area which in the common layer plane projects laterally beyond the second layer, so that a residual planarization layer results; and (e) applying a termination layer onto the layer sequence and the residual planarization layer.

In accordance with at least one additional embodiment of the invention, a method of manufacturing an acoustic mirror provides alternately arranged layers of high and low acoustic impedances, wherein the layer with low acoustic impedance includes a dielectric material, and the layers with high acoustic impedances includes a metal, wherein the layers are arranged in parallel in relation to a common layer plane. The method includes the steps of (a) providing a basic material having an etch stop layer; (b) creating a first metal layer which partially covers the etch stop layer; (c) creating a first dielectric layer on the first metal layer; (d) creating a second metal layer on the first dielectric layer; (e) applying a planarization layer onto the second metal layer and the etch stop layer, with a layer thickness which corresponds to at least the layer thickness of the two metal layers and of the dielectric layer; (f) removing the planarization layer in an area which in the common layer plane projects laterally beyond the second metal layer, so that a residual planarization layer results; and (g) applying a termination layer of a non-metallic material onto the second metal layer, the termination layer covering at least part of the remaining planarization layer.

The disclosed method enables the manufacture of a highly planar acoustic mirror and produces a mirror ensuring both excellent uniformity in the layer deposition and a planar surface of the entire mirror structure. Thus, according to at least one embodiment of the invention, optimum processing of the layers lying above the mirror is enabled, which particularly results in high acoustic quality, high piezoelectric coupling and extraordinary mode purity. The very homogeneous layer thickness distribution in the mirror which may thus be achieved enables minimum excitation of undesired vibrational modes.

According to at least one embodiment of the invention, the acoustic mirror is manufactured by a suitable combination of depositing and structuring steps to achieve a completely planar mirror surface at low processing cost. To this end, in at least one embodiment in accordance with the invention, all mirror layers down to the last metal layer are deposited. Then the layers present are structured, for example by means of a dry-etching step. In this etching step, it is advantageous to generate an end point which is clearly defined. Ideally, the etching process stops on a thin, highly selective stop layer underlying the bottommost mirror metal. An example of an etching process is a fluorine dry-etching step which stops on an AlN layer. Utilization of a stop layer additionally eliminates variations in the resulting step height that would be created by non-uniform etch lift-off. Eventually, in accordance with at least one embodiment of the invention, a planarization layer having a thickness which preferably corresponds to the step height is deposited on the entire surface area and is opened in an area which is, for example, 0.5 to 1 μm larger than the mirror layer which has already been structured. With correct processing, a substantially planar surface with narrow pits having widths of 0.5 to 1 μm around the mirror layers should have formed.

In accordance with at least one embodiment of the invention, the subsequent deposition of the topmost, normally non-metallic mirror or termination layer involves completely filling up the pits due to their small widths. This process is conducted similarly to a W-plug via process. After the mirror processing has been conducted, this will leave a surface which, apart from slight, narrow depressions in the area of the pit, is planar.

In a further embodiment of the present invention, the steps that have just been described are applied separately for one or more metallic mirror layers. This means that for each newly deposited metal layer, structuring, for example by means of a dry-etching process, is initially conducted. Then a planarization layer is deposited which, in turn, is open in an area which is larger than the metallic layer, and the non-metallic layer is deposited. Then, the steps are repeated. This successive mode of operation might be necessary, inter alia, where complete etching of all mirror layers at once is not possible. For example, this might be the case when a respective etching process is not available.

Preferably, the etching processes can be performed, for example, using a resist mask or using a hard mask, wherein in the first embodiment the use of a hard mask may be necessary due to the longer etching time.

In the above-described embodiment, the plurality of layers could be performed, for example, either in an etching process within one chamber or by several successive etching processes in various chambers.

An advantage of at least one of the embodiments of the present invention is that a highly planar surface of the last mirror or termination layer is achieved while avoiding CMP processes. In accordance with at least one embodiment of the present invention, this is possible when the planarization layer is removed in an area which projects beyond the area of the last layer, and when any pits that might arise are filled up by the subsequent layer.

In the subsequent description of the preferred embodiments of the present invention, the same or similarly acting elements are provided with the same reference numerals. In the subsequent explanations, it is assumed that the layer to be structured has a higher acoustic impedance. The present invention is not limited to this embodiment, the inventive method rather works in fully analog manner when the layer to be structured has the smaller acoustic impedance. As has already be mentioned, layers of high or low acoustic impedances, respectively, are understood to mean layers which define, when superimposed, a transition area where acoustic waves are reflected; to be precise, the larger the difference between the acoustic impedances of the layers, the higher the intensity with which acoustic waves are reflected.

With reference to FIG. 1, a first embodiment of the present invention will be explained in more detail, specifically an embodiment of the inventive processing of an acoustic mirror having a layer with high acoustic impedance. To this end, initially all mirror layers, including the layer with high acoustic impedance, are deposited and then structured. This is performed in the following sub-steps.

Figure 1A:
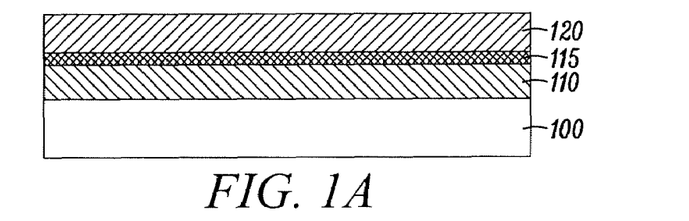
FIGS. 1(a) to 1(e) show the steps for manufacturing a highly planar acoustic mirror according to at least one embodiment of the present invention.

FIG. 1(a) shows a substrate 100, on the surface of which are arranged a first layer 110 with low acoustic impedance and an optional etch stop layer 115. If the first layer 110 with low acoustic impedance consists of a suitable material, the optional etch stop layer 115 may be dispensed with. This is the case when the etching process used for structuring stops on layer 110, i.e. when layer 110 already is operative as an etch stop layer. Subsequently, a first layer 120 with high acoustic impedance is deposited on the whole surface area of the optional etch stop layer 115. The layout of the layers is such that they are arranged in parallel in relation to a common layer plane. The layer materials that may be used for layers with low acoustic impedance are, for example, oxides, and for layers with high acoustic impedance, tungsten layers, for example, or another suitable conductive layer are suited. In addition, as it has been described above, one or more intermediate layers may be provided between the substrate and the mirror or between the mirror layers.

Then the layer with high acoustic impedance is subjected to a structuring step. This may be conducted, for example, in a dry etching step, which exhibits the crucial advantage that layer 110 or optional etch stop layer 115 defines a clearly defined end point on which the etching process ideally stops.

For a fluorine dry etching step, an AlN layer, for example, may be used as the optional etch stop layer 115. Using a hard mask or a resist mask, the structure shown in FIG. 1(a) is subjected, for example, to an etching process by which the first layer 120 with high acoustic impedance is structured to the shape shown in FIG. 1(b).

Figure 1B:
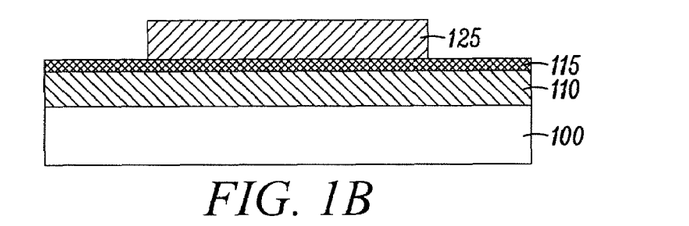
Figure 1C:
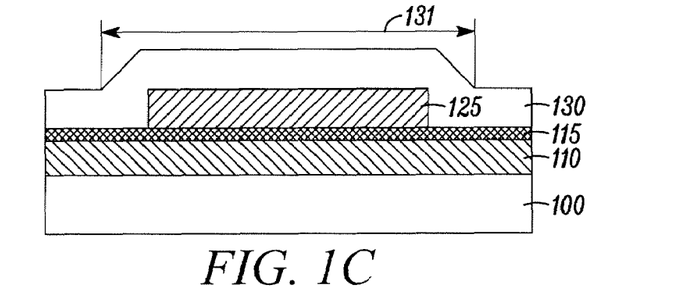

On the whole area of structure shown in FIG. 1(b), a planarization layer 130 is then deposited, as this is shown in FIG. 1(c). Preferably, the planarization layer 130 is deposited in a thickness which corresponds to the step height and thus, in the embodiment represented, to the thickness of layer 125. The planarization layer 130 is then structured using a suitable mask, for example a resist mask or a hard mask, so as to define the portions of the planarization layer 130 to be removed in a subsequent process, preferably an etching process.

Figure 1D:
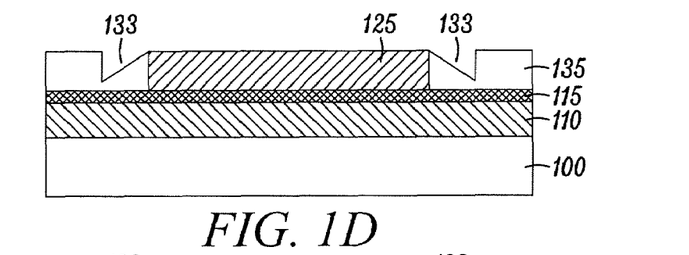

The structure shown in FIG. 1(c) after the masking and after the etching process is shown in FIG. 1(d). In accordance with at least one embodiment of the inventive concept, the planarization layer 130 is lifted off in an area larger than the structured layer with high acoustic impedance 125. This area includes at least region 131 shown in FIG. 1(c). This may occur in an area which is 0.1 to 2.5 μm (preferably 0.5 to 1 μm) larger than the already structured layer 125 with high acoustic impedance. In the process, pits 133 may form on both sides of the structured layer 125 with high acoustic impedance. The shape and depth of pits 133 are determined, on the one hand, by the duration and/or the type of the etching process, primarily, however, by the shape of planarization layer 130. The intensity of flanks and/or slants at the edges of planarization layer 130 in region 131 is determined, in particular, by the shape of pits 133, as has been indicated in FIG. 1(d). In an ideal case, when planarization layer 130 exhibits no slants in region 131, i.e. when planarization layer 130 accurately reproduces the step of the layer with high acoustic impedance 125 and when the mask used leaves open only region 131, no pits 133 will form. In any other processing of planarization layer 130 which deviates from this ideal case, the pits 133 will form. Similarly, the selection of the mask, i.e. the precision with which it covers the predefined area, so that no clearances will form at the edge of the mask, has an influence on the shape of pits 133. In any case, the maximum depth of pits 133 is limited by layer 110 acting as an edge stop, and is therefore predefined by the thickness of planarization layer 130.

When planarization layer 130 exhibits a preferred thickness which corresponds to the thickness of the first structured layer 125 with high acoustic impedance, this results, except for pits 133, in a planar surface having a residual planarization layer 135. With correct processing, the pits may have widths of 0.1 to 2.5 µm (preferably of 0.5 to 1 µm).

Figure 1E:
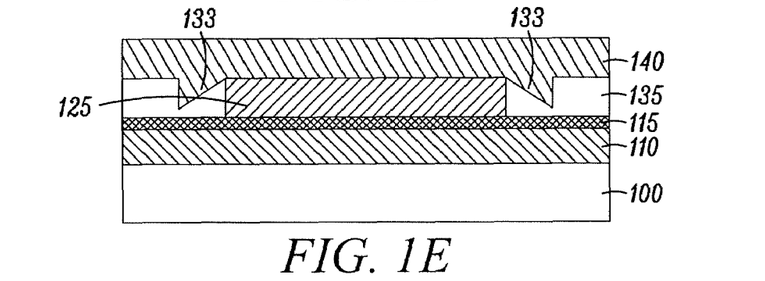

As a final step, represented in FIG. 1(e), a termination layer with low acoustic impedance 140, which normally consists of a non-metallic material, is applied such that pits 133 are filled up on both sides of the structured layer with high acoustic impedance 125. Filling-up may be conducted similarly to a W-plug-via-process and leaves an acoustic mirror having a surface which, except for any slight narrow depressions that might be present in the area of the pits (not shown in the Figure), is planar.

With reference to FIG. 2, another embodiment of the present invention will be explained in more detail below. It involves processing an acoustic mirror having a plurality of layers with high acoustic impedances by shared structuring and planarization of all layers, the embodiment here being described by means of two layers 120 and 150 with high acoustic impedances.

Figure 2A:
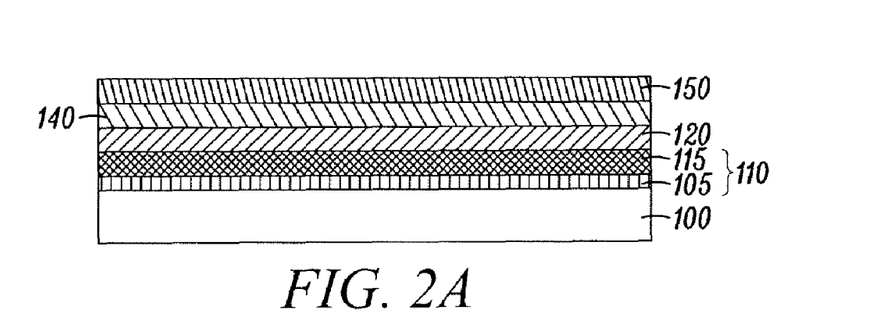
FIGS. 2(a) to 2(e) show at least one embodiment of the inventive processing of an acoustic mirror with two layers with high acoustic impedances by common structuring and planarizing according to a second preferred embodiment.
Figure 2B:
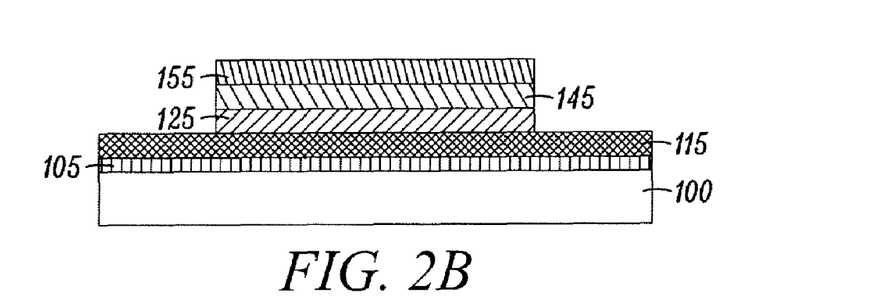

FIG. 2(a) shows a substrate 100 separated from an edge stop layer 115 by an optional intermediate layer 105. This intermediate layer may be important, in particular, when the material of etch stop layer 115 exhibits only insufficient adhesion to the underlying substrate 100 and/or when undesired reactions may be triggered in a transition area of etch stop layer 115 and substrate 100. Like in FIG. 1, both may also be combined into a layer structure 110 which at the same time acts as a stop layer for an etching process. In contrast to the previously described embodiment, the layer sequence consisting of a layer with high acoustic impedance 120, a layer with low acoustic impedance 140, and a layer with high acoustic impedance 150 is deposited onto the layer structure 110. This is depicted in FIG. 2(a).

The structure shown in FIG. 2(a) is then subjected to a structuring process, preferably an etching process, wherein the bottommost layer structure 110 is not structured. By customary masking and etching steps, the layer sequence of the layers 120, 140, and 150 is given the desired structure shown in FIG. 2(b) and consisting of a first layer with high acoustic impedance 125, a layer with low acoustic impedance 145, and a second layer with high acoustic impedance 155. This is performed by analogy with the step described with regard to FIG. 1(b).

Figure 2C:
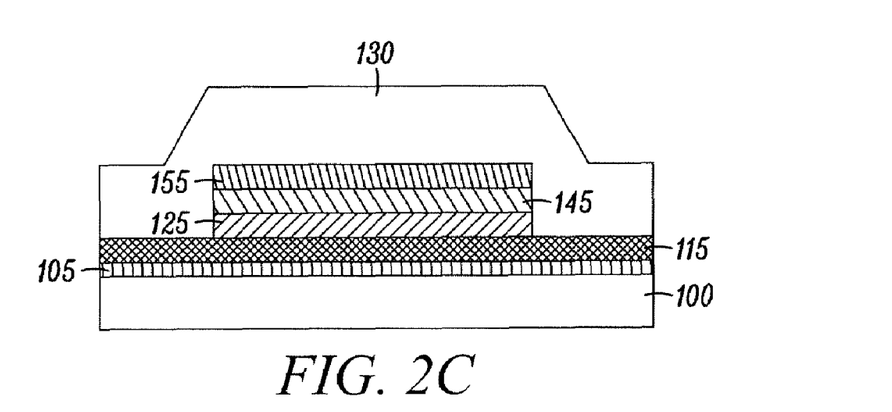
Figure 2D:
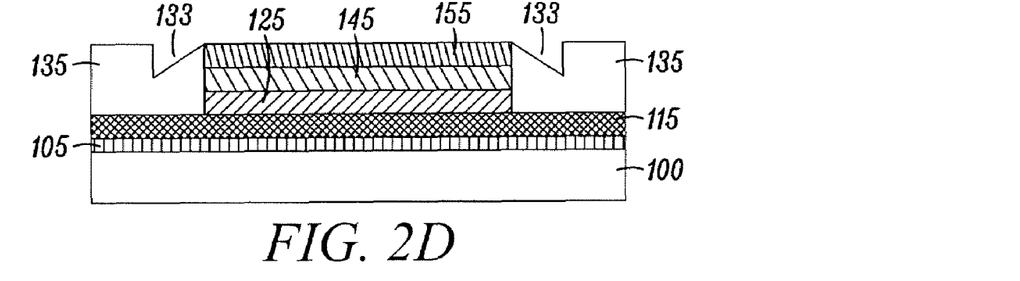

A planarization layer 130 is deposited over this structure, so that the structure shown in FIG. 2(c) results. Similar to the preceding embodiment, structuring of the planarization layer 130 now takes place such that an upper surface of the topmost layer 155 with high acoustic impedance is exposed, so that lateral pits, such as a pit 133, may form, and so that in addition, a residual planarization layer 135 will form. The (potential) formation of these pits 133 is a consequence of utilizing an etching mask which is larger than the surface of the second layer with high acoustic impedance 155. As regards the shapes and sizes of the pits, reference shall be made to the annotations for FIG. 1(d).

In a preferred embodiment, just like in the above-described example, planarization layer 130 preferably has such a thickness that the resulting thickness of the residual planarization layer 135 equals the thickness of the layer sequence consisting of layers 125, 145 and 155. In a final step, depicted in FIG. 2(e), a termination layer 140 is applied onto the layer sequence such that the pits 133 are filled up by termination layer 140, and such that, thus, a planar surface forms.

Figure 2E:
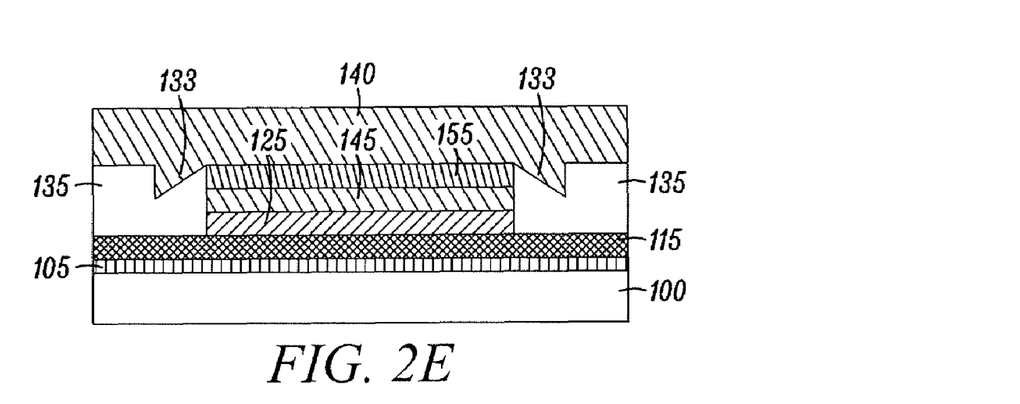

A lower electrode, a piezoelectric layer, as well as an upper electrode may be applied onto the structure shown in FIG. 2(e), just like in the previously described embodiment, in order to manufacture a piezoelectric resonator.

FIG. 3 relates to a further variant of the processing, wherein several layers with high acoustic impedances are separately structured and planarized. This may be required, for example, when complete etching of all mirror layers at once is not possible, for example because a respective process is not available. In this method it is assumed, in addition, that the application of etch stop layers may be dispensed with. This is the case when the layers with low acoustic impedances comprise a layer material which is suitable as an etch stop layer material for the etching process employed.

Since the first four steps of this processing correspond to the steps described in FIGS. 1(a) to 1(d), repeated presentation of these steps is dispensed with. The step shown in FIG. 1(e) is different only in that in the processing described here, layer 140 represents no termination layer, but a second layer with low acoustic impedance. Applying layer 140, however, is also performed such that the pits 133 which may have formed are filled up by second layer 140.

Figure 3A:
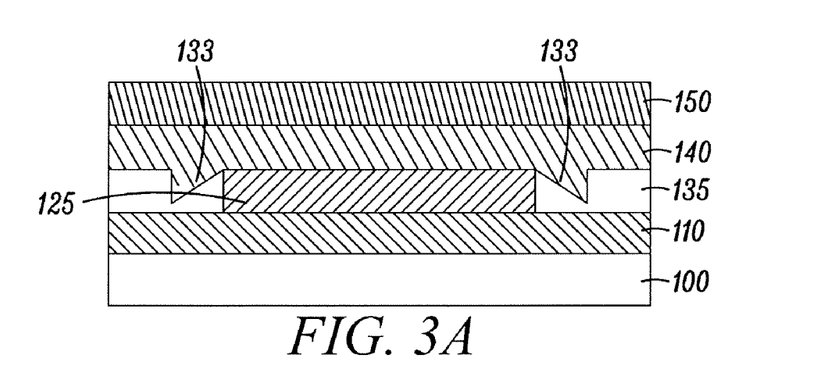
FIGS. 3(a) to 3(e) show at least one embodiment of the inventive processing of an acoustic mirror with two layers with high acoustic impedances by repeated deposition, structuring, and planarizing steps.

Subsequently, a second layer with high acoustic impedance 150 is applied onto the second layer with low acoustic impedance 140, so that the structure shown in FIG. 3(a) results which has two layers with high acoustic impedances 125 and 150, and two layers with low acoustic impedances 110 and 140.

Figure 3B:
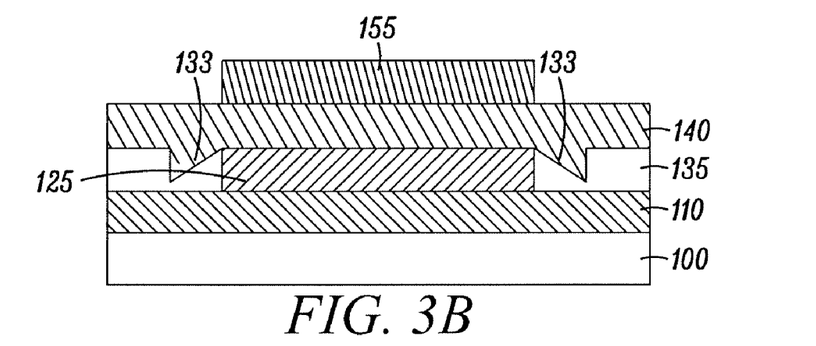
Figure 3C:
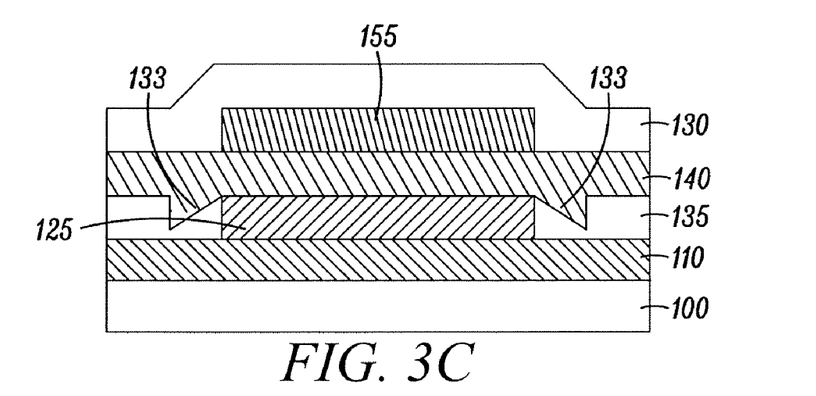
Figure 3D:
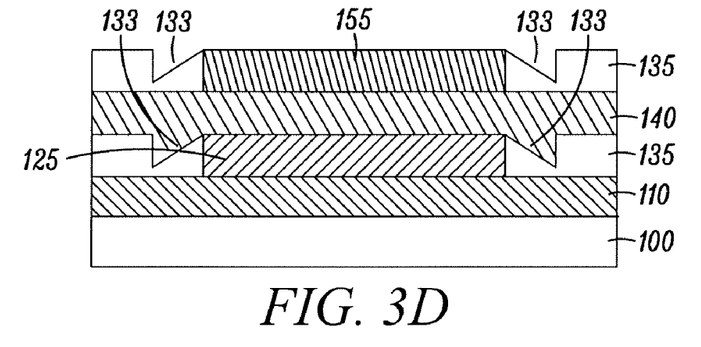

In the following step, second layer 150 with high acoustic impedance is structured, so that a second structured layer, depicted in FIG. 3(b), with high acoustic impedance 155 results. A second planarization layer 130 is deposited over the whole area, as is shown in FIG. 3(c). Second planarization layer 130 is structured using a suitable mask, for example a resist mask or a hard mask, so as to define those portions of second planarization layer 130 which are to be removed in a subsequent process, preferably an etching process. In FIG. 3(d), the structure shown in FIG. 3(c) is depicted after the masking and after the etching process. Since, in accordance with at least one embodiment of the inventive concept, the second planarization layer 130 is removed in an area larger than the second structured layer with high acoustic impedance 155, the etching process will lead to further pits 133 at both edges of the structured layer 155. A second residual planarization layer 135 will form in the process.

Figure 3E:
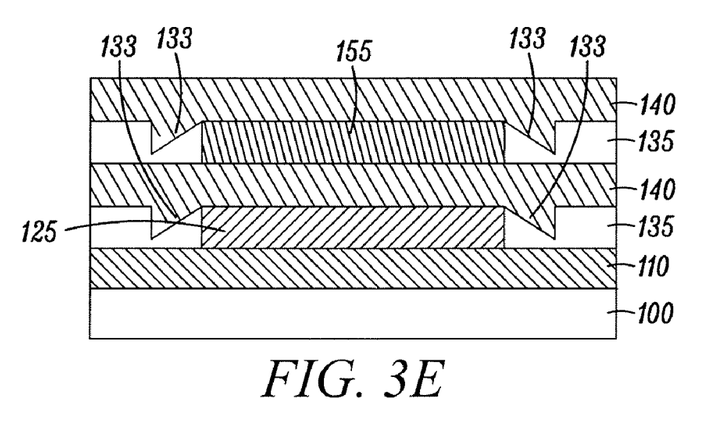

As a final step, depicted in FIG. 3(e), a termination layer with low acoustic impedance 140 is applied such that, again, the pits 133 on both sides of the second structured layer with high acoustic impedance 155 are filled up. Thus, one obtains an acoustic mirror having a highly planar surface.

Although the above-described acoustic mirrors according to embodiments of the present invention comprise a layer with high acoustic impedance, for example a metal layer, as the topmost layer, the present invention is not limited to such a mirror structure. Rather, by means of at least one embodiment of the inventive method, also a mirror structure the topmost surface of which is a layer with high acoustic impedance may be produced. Furthermore, tungsten layers were mentioned above as layer with high acoustic impedance, and oxide layers were mentioned as layer with low acoustic impedance. The present invention is not limited to these materials, but other materials having high acoustic impedance or low acoustic impedance, conductive or non-conductive materials, may be equally employed.

In further embodiments, the number of layers of low and high acoustic impedances may be varied. For the embodiment explained in FIG. 1 this means that a further layer with high acoustic impedance, which in subsequent steps is again structured and covered by a layer with low acoustic impedance, may be deposited onto termination layer 140 in FIG. 1(j). Then, in embodiments, further layers of high and low acoustic impedances may be deposited. The same applies also to the embodiment explained in FIG. 2. This means that here, too, further layers of high and low acoustic impedances will follow which are either all structured together in the end or as pairs, consisting of a layer of high, and of a layer with low acoustic impedances.

An advantage of at least one embodiment of the present invention is that a highly planar surface of the last mirror or termination layer is achieved while avoiding CMP processes. In accordance with at least one embodiment of the present invention, this is possible when the planarization layer is removed in an area which projects beyond the area of the last layer, and when the possibly occurring pits are filled up by the subsequent layer.

The above-described structured acoustic mirror layers may also have different sizes, so that a structure of truncated cone or truncated pyramid shape results. In principle, the layout of the resonator/mirror may, however, have any shape desired (e.g. a trapezoid), whereby an interesting shape results for the three-dimensional mirror.

In connection with the subject of the disclosed embodiments, however, it is to be noted that the shape of the mirror is insignificant. The structured layers may thus all be equally large or not (i.e. cuboids or truncated pyramid or the like).

Furthermore, one or more embodiments of the present invention are independent of the thickness of the layers in the mirror. The acoustic mirror usually is no $\lambda/4$ mirror (wherein $\lambda$ is the wavelength of an acoustic wave), since there are various modes and wave types (longitudinal/shear waves). This means that the layer thickness is not defined by $\lambda/4$, and for this reason, it is mostly favorable to make the layer construction not periodic, i.e. each layer has different thickness.

The above description of the preferred embodiments substantially relates to the acoustically and/or electrically relevant layers in the mirror. Beside these layers, however, further layers and/or intermediate layers may also be provided. Such intermediate layers may serve to further influence the acoustic properties of the acoustic mirror, the resonator structure, or the overall structure. Furthermore, one or more structured or non-structured layers, for example tuning layers and/or passivation layers, may be applied onto the overall structure as a protection and/or for further influencing the acoustic properties of the overall structure.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method of manufacturing an acoustic mirror, the method comprising:
   (a) providing a basic material having a first layer of a layer sequence on the basic material;
   (b) applying a second layer of the layer sequence on the first layer, the second layer of the layer sequence partially covering the first layer, the first layer and the second layer providing a layer sequence of alternately arranged layers of high acoustic impedance and low acoustic impedance, wherein the first and second layers are arranged in parallel in relation to a common layer plane;
   (c) applying a planarization layer on the layer sequence;
   (d) removing the planarization layer in an area which, in relation to the common layer plane, projects outward beyond the second layer, wherein removal of the planarization layer in the area results in a residual planarization layer comprising a pit; and
   (e) applying a termination layer onto the layer sequence and the residual planarization layer.

2. The method of claim 1 wherein the planarization layer is applied with a layer thickness which is greater than or equal to a thickness of the second layer.

3. The method of claim 1 wherein the planarization layer is applied with a layer thickness which is about the same as a thickness of the second layer.

4. The method of claim 1 wherein the step of creating the second layer comprises the following sub-steps: (b1) applying a second layer material; and (b2) structuring the second layer material.

5. The method of claim 4 wherein the sub-step of structuring comprises an etching process wherein the first layer provides an etch stop layer.

6. The method of claim 1 wherein the first layer comprises a dielectric material, and wherein the second layer comprises a conductive material.

7. The method of claim 1 further comprising the steps of: following the step of creating the second layer, creating a further layer with low acoustic impedance on the second layer; and creating a further layer with high acoustic impedance on the further layer with low acoustic impedance so as to create the layer sequence.

8. The method of claim 7 wherein the step of creating a further layer with high acoustic impedance comprises the following sub-steps: applying a further layer material with high acoustic impedance; and structuring the further layer material with high acoustic impedance.

9. The method of claim 8 wherein the sub-step of structuring the further layer comprises an etching process wherein the further layer with low acoustic impedance becomes operative as an etch stop layer.

10. The method of claim 1 wherein the step of removing the planarization layer comprises an etching process.

* * * * *